(12) United States Patent
Ueda et al.

(10) Patent No.: US 9,508,679 B2
(45) Date of Patent: Nov. 29, 2016

(54) MOUNTING METHOD

(71) Applicant: PANASONIC INTELLECTUAL PROPERTY MANAGEMENT CO., LTD., Osaka (JP)

(72) Inventors: Mitsuhiko Ueda, Osaka (JP); Yoshiharu Sanagawa, Osaka (JP); Takanori Aketa, Osaka (JP); Shintaro Hayashi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/420,181

(22) PCT Filed: Mar. 11, 2013

(86) PCT No.: PCT/JP2013/001558
§ 371 (c)(1),
(2) Date: Feb. 6, 2015

(87) PCT Pub. No.: WO2014/024343
PCT Pub. Date: Feb. 13, 2014

(65) Prior Publication Data
US 2015/0287696 A1    Oct. 8, 2015

(30) Foreign Application Priority Data
Aug. 8, 2012   (JP) ................... 2012-176279

(51) Int. Cl.
*H01L 23/00*       (2006.01)
*B23K 20/00*       (2006.01)
(Continued)

(52) U.S. Cl.
CPC .............. *H01L 24/97* (2013.01); *B23K 20/00* (2013.01); *H01L 21/52* (2013.01); *H01L 24/29* (2013.01);
(Continued)

(58) Field of Classification Search
CPC ............ H01L 2224/83825; H01L 222/68381; H01L 2224/83207; H01L 2224/8383; H01L 2224/32501
See application file for complete search history.

(56) References Cited

U.S. PATENT DOCUMENTS 5,090,609 A      2/1992  Nakao et al.
2007/0075422 A1  4/2007  Fujii et al.
(Continued)

FOREIGN PATENT DOCUMENTS

JP    53-20859    2/1978
JP    64-25548    1/1989
(Continued)

OTHER PUBLICATIONS

Search report from PCT/JP2013/001558, mail date is Jun. 11, 2013.
(Continued)

*Primary Examiner* — Caleb Henry
*Assistant Examiner* — Mounir Amer
(74) *Attorney, Agent, or Firm* — Greenblum & Bernstein, P.L.C.

(57) ABSTRACT

A mounting method of mounting chips on a substrate includes a temporarily-bonding process, and a main-bonding process. Temporarily-bonding process is to perform a first basic process, repeatedly depending on the number of the chips. First basic process includes a first step and a second step. First step is to align, on a first metal layer of the substrate, a second metal layer of each chip. Second step is to temporarily bond each chip by subjecting the first and second metal layers to solid phase diffusion bonding. Main-bonding process is to perform a second basic process, repeatedly depending on the number of the chips. Second basic process includes a third step and a fourth step. Third step is to recognize a position of each chip temporarily mounted on the substrate. Fourth step is to firmly bond each chip by subjecting the first and second metal layers to liquid phase diffusion bonding.

3 Claims, 5 Drawing Sheets

(51) Int. Cl.
*H01L 21/52* (2006.01)
*H01L 21/683* (2006.01)

(52) U.S. Cl.
CPC .............. *H01L 24/32* (2013.01); *H01L 24/75* (2013.01); *H01L 24/83* (2013.01); H01L 21/6836 (2013.01); H01L 24/05 (2013.01); H01L 24/27 (2013.01); H01L 24/30 (2013.01); H01L 2221/68327 (2013.01); H01L 2221/68381 (2013.01); H01L 2224/04026 (2013.01); H01L 2224/05155 (2013.01); H01L 2224/05166 (2013.01); H01L 2224/05664 (2013.01); H01L 2224/05669 (2013.01); H01L 2224/2745 (2013.01); H01L 2224/2746 (2013.01); H01L 2224/2908 (2013.01); H01L 2224/29011 (2013.01); H01L 2224/29012 (2013.01); H01L 2224/29013 (2013.01); H01L 2224/29082 (2013.01); H01L 2224/29111 (2013.01); H01L 2224/29144 (2013.01); H01L 2224/29147 (2013.01); H01L 2224/3003 (2013.01); H01L 2224/32225 (2013.01); H01L 2224/32227 (2013.01); H01L 2224/32501 (2013.01); H01L 2224/32505 (2013.01); H01L 2224/48091 (2013.01); H01L 2224/48227 (2013.01); H01L 2224/73265 (2013.01); H01L 2224/75252 (2013.01); H01L 2224/75301 (2013.01); H01L 2224/75744 (2013.01); H01L 2224/75745 (2013.01); H01L 2224/75753 (2013.01); H01L 2224/75901 (2013.01); H01L 2224/8301 (2013.01); H01L 2224/8309 (2013.01); H01L 2224/83013 (2013.01); H01L 2224/83065 (2013.01); H01L 2224/83075 (2013.01); H01L 2224/8383 (2013.01); H01L 2224/83123 (2013.01); H01L 2224/83127 (2013.01); H01L 2224/83193 (2013.01); H01L 2224/83203 (2013.01); H01L 2224/83207 (2013.01); H01L 2224/83805 (2013.01); H01L 2224/83825 (2013.01); H01L 2224/83906 (2013.01); H01L 2224/83907 (2013.01); H01L 2224/92247 (2013.01); H01L 2224/97 (2013.01); H01L 2924/01322 (2013.01); H01L 2924/10161 (2013.01); H01L 2924/10162 (2013.01); H01L 2924/12041 (2013.01); H01L 2924/12042 (2013.01); H01L 2924/12043 (2013.01); H01L 2924/1461 (2013.01)

(56) References Cited

U.S. PATENT DOCUMENTS

| | | |
|---|---|---|
| 2009/0137082 A1 | 5/2009 | Kurita |
| 2011/0065239 A1 | 3/2011 | Hosomi |
| 2014/0008801 A1* | 1/2014 | Chen .................. H01L 24/29 |
| | | 257/751 |

FOREIGN PATENT DOCUMENTS

| | | |
|---|---|---|
| JP | 3-171643 | 7/1991 |
| JP | 11-297748 | 10/1999 |
| JP | 2006-54311 | 2/2006 |
| JP | 2007-287834 | 11/2007 |
| JP | 2009-130293 | 6/2009 |
| JP | 2010-157764 | 7/2010 |
| JP | 2011-61073 | 3/2011 |
| JP | 2012-9909 | 1/2012 |

OTHER PUBLICATIONS

Search Report issued by E.P.O. patent office in E.P.O. Patent Application No. 13828355.1, dated Aug. 11, 2015.

* cited by examiner

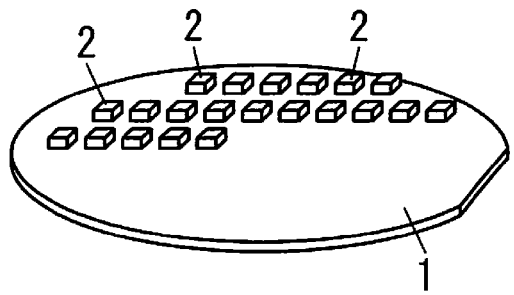
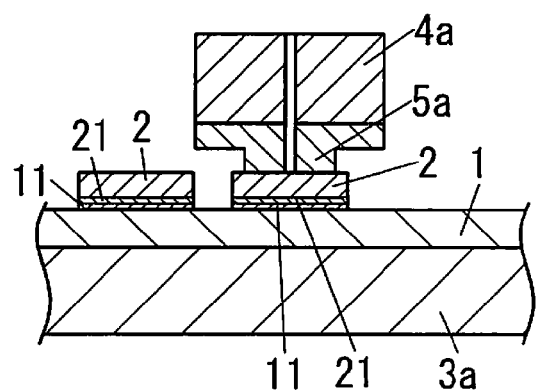
FIG. 1A  FIG. 1B
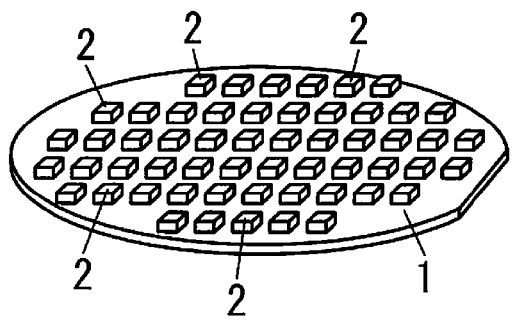
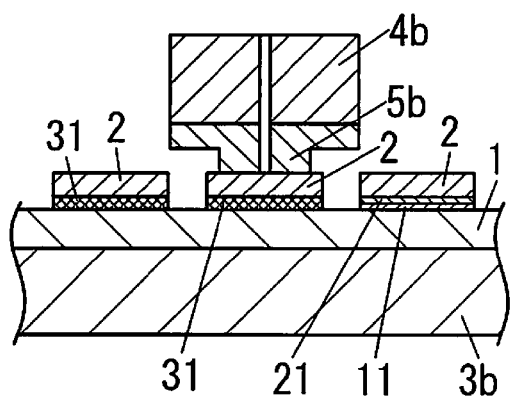
FIG. 1C  FIG. 1D
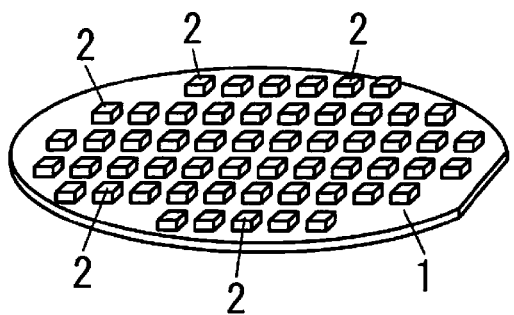
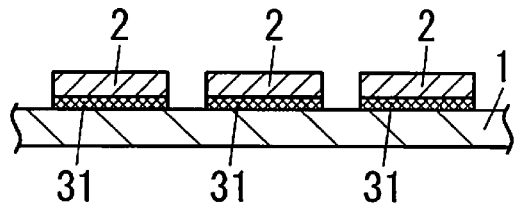
FIG. 1E  FIG. 1F

MOUNTING METHOD

TECHNICAL FIELD

The invention relates to a mounting method of mounting chips on a substrate.

BACKGROUND ART

Conventionally, there has been known a mounting method of mounting chips on a substrate (e.g., JP 2009-130293 A). The mounting method in this document includes a substrate-placement process of placing the substrate on a surface of a stage of a die bonding apparatus, and a bonding process of bonding a chip on the substrate by applying heat from a side of the chip, in order to heat a bonding surface of the chip and a bonding surface of the substrate placed on the surface of the stage, while the bonding surface of the chip is brought into contact with the bonding surface of the substrate.

In the substrate-placement process, the substrate is placed on the surface of the stage in a state where a heat insulation layer is between the stage and a schedule region of the substrate, on which the chip is bonded. As an example of the chip, an LED chip is shown, in which electrodes (not shown) are respectively provided on both surfaces of the LED chip in a thickness direction thereof. The LED chip includes a chip-side-bonding electrode formed of AuSn, as an electrode on a reverse side (a side closer to the substrate) thereof. In addition, it is shown that the substrate is formed with a silicon wafer, as an example. The substrate is provided with die pads as substrate-side-bonding electrodes, in schedule regions of the substrate on which the respective chips are bonded (at placement positions). Each die pad has a stacking structure of a Ti film and an Au film formed on the Ti film, and a portion of each die pad on the surface side is formed of Au.

In the bonding process, a prescribed step is performed, repeatedly depending on the number of LED chips to be mounted on the wafer. In the prescribed step, an LED chip is held by suction with a suction collet that is provided at a head of the die bonding apparatus, and is heated to a defined bonding temperature by a heater of the head through the suction collet. In this state, a bonding surface of the chip-side-bonding electrode is brought into contact with that of the corresponding substrate-side-bonding electrode, and then appropriate pressure is kept applied to the LED chip during a defined time period from the head side, and thereby the chip-side-bonding electrode and the substrate-side-bonding electrode are subjected to eutectic bonding. The defined bonding temperature is set higher than, for example, a melting temperature of AuSn that is material for the chip-side-bonding electrode. The appropriate pressure is set to be in, for example, a range of 2 kg/cm$^2$ to 50 kg/cm$^2$. The defined time period is set to about 10 sec for example.

Here, it is expected that the mounting method in the above document is required to recognize the chip with high accuracy through a recognition device of the die bonding apparatus, before the chip is held by the suction of the suction collet. In addition, it is expected that the mounting method in the above document is required to recognize a corresponding schedule region of the substrate on the surface of the stage with high accuracy through the recognition device, for aligning the chip on the substrate, before the bonding surface of the chip-side-bonding electrode is brought into contact with that of the corresponding substrate-side-bonding electrode. Therefore, for the above mounting method, it is hard to shorten tact time to be required for a mounting process in a production line, and improve throughput in the mounting process. Note that, the recognition device is generally constituted by a camera, an image processing unit and a monitor.

DISCLOSURE OF THE INVENTION

It is an object of the present invention to provide a mounting method, which can shorten tact time.

A mounting method of the present invention, of mounting chips on a substrate, includes a temporarily-bonding process and a main-bonding process. The temporarily-bonding process is to temporarily individually bond the chips on the substrate. The main-bonding process is to firmly individually bond, on the substrate, the chips temporarily bonded on the substrate. The temporarily-bonding process is to perform a first basic process, repeatedly depending on the number of the chips to be mounted on the substrate. The first basic process includes a first step and a second step. The first step is to align, on a first metal layer of the substrate, a second metal layer of each chip. The second step is to temporarily bond each chip on the substrate by applying pressure from a side of each chip after the first step to subject the first and second metal layers to solid phase diffusion bonding. The main-bonding process is to perform a second basic process, repeatedly depending on the number of the chips on the substrate. The second basic process includes a third step and a fourth step. The third step is to recognize a position of each chip temporarily mounted on the substrate. The fourth step is to firmly bond each chip on the substrate by applying pressure from the side of each chip after the third step to subject the first and second metal layers to liquid phase diffusion bonding.

In the mounting method, preferably, the solid phase diffusion bonding is performed at a first defined temperature, and the liquid phase diffusion bonding is performed at a second defined temperature that is higher than the first defined temperature, by applying heat from at least one side of the side of each chip and a side of the substrate.

In the mounting method, preferably, the first defined temperature is lower than a lower one of melting temperatures of the first and second metal layers, and the second defined temperature is equal to or higher than a higher one of the melting temperatures of the first and second metal layers.

In the mounting method, preferably, the solid phase diffusion bonding is ultrasonic bonding or surface activation bonding.

According to the mounting method of the present invention, it is possible to shorten tact time.

BRIEF DESCRIPTION OF THE DRAWINGS

Preferred embodiments of the present invention will now be described in further details. Other features and advantages of the present invention will become better understood with regard to the following detailed description and accompanying drawings where:

FIG. 1A is a schematic perspective view for explaining a mounting method according to an embodiment;

FIG. 1B is a schematic cross sectional view for explaining the mounting method according to the embodiment;

FIG. 1C is a schematic perspective view for explaining the mounting method according to the embodiment;

FIG. 1D is a schematic cross sectional view for explaining the mounting method according to the embodiment;

FIG. 1E is a schematic perspective view for explaining the mounting method according to the embodiment;

FIG. 1F is a schematic cross sectional view for explaining the mounting method according to the embodiment;

BEST MODE FOR CARRYING OUT THE INVENTION

A mounting method according to the present embodiment will be described below with reference to FIG. 1A to FIG. 6B.

As shown in FIGS. 1E and 1F, the mounting method according to the present embodiment is to mount chips 2 on a substrate 1. The mounting method includes a temporarily-bonding process (see FIGS. 1A and 1B) of temporarily individually bonding the chips 2 on the substrate 1, and a main-bonding process (see FIGS. 1C and 1D) of firmly individually bonding, on the substrate 1, the chips 2 temporarily bonded on the substrate 1. In the mounting method, bonding strength between the substrate 1 and each chip 2 after the main bonding is higher than that after the temporarily bonding.

The temporarily-bonding process is to perform a first basic process, repeatedly depending on the number of the chips 2 to be mounted on the substrate 1. In other words, the first basic process is performed to each of the chips 2 on the substrate 1 individually. The first basic process includes a first step and a second step.

Figure 2A:
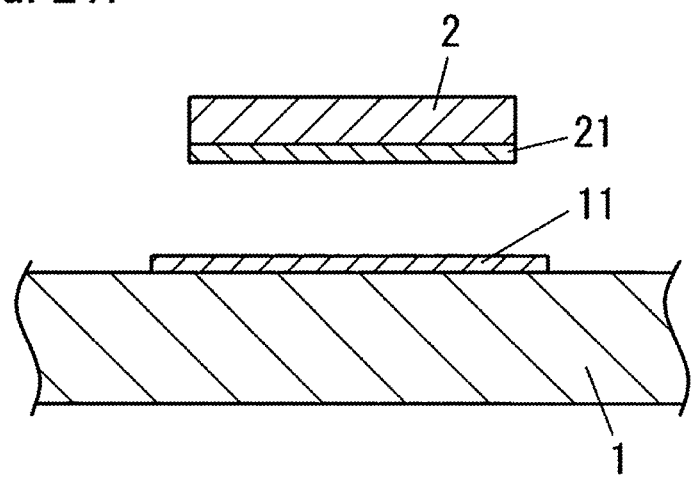
FIG. 2A is an explanatory drawing for a first step in the mounting method according to the embodiment.

As shown in FIG. 2A, in the first step, a second metal layer 21 of each chip 2 is aligned on a first metal layer 11 of the substrate 1.

As shown in FIG. 1B, in the second step after the first step, pressure is applied from a side of each chip 2 to subject the second metal layer 21 of each chip 2 and the first metal layer 11 of the substrate 1 to solid phase diffusion bonding at a first defined temperature, and accordingly, each chip 2 is temporarily bonded on the substrate 1. The solid phase diffusion bonding is a method of bonding, in a solid phase state, a bonding surface of the second metal layer 21 of each chip 2 and a bonding surface of the first metal layer 11 of the substrate 1. The first defined temperature is set lower than a lower one of melting temperatures of the first and second metal layers 11 and 21. The temporarily bonding mentioned here means bonding for holding each chip 2 in a state where each chip 2 is at a prescribed position on the substrate 1 before the main bonding is performed.

Figure 2B:
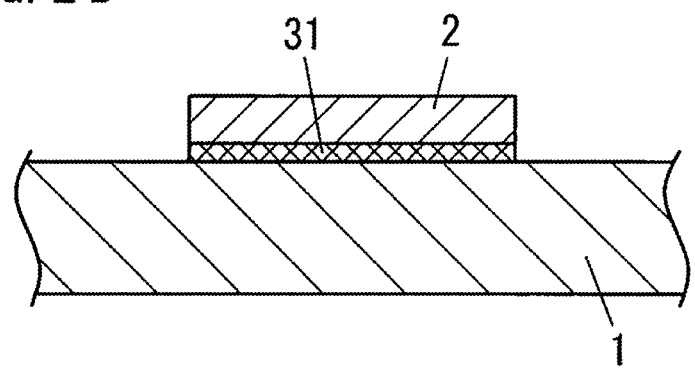
FIG. 2B is an explanatory drawing for a main-bonding process in the mounting method according to the embodiment.

As shown in FIGS. 1D and 2B, the main-bonding process is to perform a second basic process, repeatedly depending on the number of the chips 2 on the substrate 1. In other words, the second basic process is performed to each of the chips 2 on the substrate 1 individually. The second process includes a third step and a fourth step.

In the third step, a position of each chip 2 temporarily mounted on the substrate 1 is recognized.

In the fourth step after the third step, pressure is applied from the side of each chip 2 to subject the second metal layer 21 of each chip 2 and the first metal layer 11 of the substrate 1 to liquid phase diffusion bonding at a second defined temperature, and accordingly, each chip 2 is firmly bonded on the substrate 1. Therefore, each chip 2 is bonded on the substrate 1 via a bonding layer 31 as an alloy layer made of parts of the first and second metal layers 11 and 21. The main bonding mentioned here means final bonding of causing a bonding state between each chip 2 and the substrate 1 to be more stable and causing its bonding strength to be higher. The second defined temperature is set equal to or higher than a higher one of the melting temperatures of the first and second metal layers 11 and 21. Accordingly, the second defined temperature is set relatively higher than the first defined temperature.

The temporarily-bonding process and the main-bonding process can be respectively performed with separate systems. Incidentally, in a production line, plural substrates 1 are processed, and chips 2 are mounted on each substrate 1 in the process. Here in the mounting method according to the present embodiment, because the temporarily-bonding process and the main-bonding process can be performed with separate systems, the temporarily-bonding process and the main-bonding process can be respectively simultaneously performed with respect to two substrates 1 that are different from each other. Here, because the temporarily-bonding process in the second step is to perform temporarily bonding by subjecting the first and second metal layers 11 and 21 to the solid phase diffusion bonding, it is possible to more shorten a required time (working time), compared with a case of performing the liquid phase diffusion bonding, following the first step. In addition, because the main-bonding process in the third step is to recognize a position of each chip 2 in a state where the chips 2 are temporarily bonded on the substrate 1, it is not required to recognize each chip 2 with high accuracy to pick up each chip 2, unlike the first step. That is, it is possible to cause recognition for each chip 2 in the third step to be simpler, compared with a case of recognizing each chip 2 and the substrate 1 with high accuracy as the first step. Therefore, in the main-bonding process, it is possible to more shorten a required time, compared with a case of performing the liquid phase diffusion bonding, following the first step. Accordingly, in the mounting method of the present embodiment, it is possible to shorten tact time for the mounting process by simultaneously performing the temporarily-bonding process and the main-bonding process, and improve throughput in the mounting process. In a mounting method in JP 2009-130293 A described above, a bonding surface of a chip-side-bonding electrode is brought into contact with that of a corresponding substrate-side-bonding electrode while an LED chip is heated to a defined bonding temperature by a heater of a head through a suction collet, and accordingly, considered is also a case where it is hard to align the chip-side-bonding electrode on the substrate-side-bonding electrode with high accuracy due to thermal fluctuation, thermal expansion or the like. On the other hand, in the mounting method of the present embodiment, the temporarily-bonding is performed at the first defined temperature relatively lower than the second defined temperature at which the main-bonding process is performed, and accordingly, it is easy to perform aligning with high accuracy.

The temporarily-bonding process and the main-bonding process may be respectively performed with for example two die bonding apparatuses, as separate systems. Each die bonding apparatus includes a bonding head, a stage, a recognition device and a control device. The bonding head, the stage and the recognition device are controlled by the control device. The control device includes a main control part configured as a microcomputer having appropriate programs, and individual control parts configured to control the bonding head, the stage and the recognition device according to an instruction of the main control part, respectively. The recognition device is constituted by a camera, an image processing unit and a monitor. Note that, components of the die bonding apparatus are not limited in particular. The respective systems for performing the temporarily-bonding process and the main-bonding process are not limited to the die bonding apparatuses.

Hereinafter, for convenience of explanation, the die bonding apparatus for the temporarily-bonding process is referred to as a first die bonding apparatus, and the die bonding apparatus for the main-bonding process is referred to as a second die bonding apparatus. Note that, the first and second die bonding apparatuses may have the same components or different components.

As the substrate 1, a wafer may be used. The wafer is made of a silicon wafer for example, and is provided with first metal layers 11 that are disposed in schedule regions on which the respective chips 2 are bonded. When the silicon wafer is used as the substrate 1, it is preferred that an insulating film, such as a silicon oxide film, is formed on a surface of the silicon wafer. Each first metal layer 11 may be configured as a flux-less AuSn film for example. The flux-less AuSn layer may be formed by a plating method or a sputtering method for example. For example, a barrier layer and a base layer for the barrier layer may be disposed between each first metal layer 11 and the insulating film. When each first metal layer 11 is an AuSn film and the insulating film is a silicon oxide film, examples of material for the barrier layer include platinum group metals, such as Pt and Pd. Examples of material for the base layer, between the barrier layer and the insulating film, include Ti and Ni.

The silicon wafer may be in a range of about 50 mm to 300 mm in diameter, and be in a range of about 200 µm to 1000 µm in thickness, for example.

Material for the substrate 1 is not limited to silicon, and may be aluminum nitride, alumina or the like. When the material for the substrate 1 is silicon, it is preferred that the substrate 1 is provided with the above-mentioned insulating film. However, when the substrate 1 is formed of insulation material such as aluminum nitride or alumina, providing of the insulating car the substrate 1 is not required.

As the chips 2, for example, LED chips may be used. Each LED chip may be 0.3 mm (i.e., 0.3 mm×0.3 mm), 0.45 mm or 1 mm in chip-size, for example. The planar shape of each LED chip is not limited to a square, and may be a rectangle for example. When the planar shape of each LED chip is a rectangle, each LED chip may be 0.5 mm×0.24 mm in chip-size, for example.

When the chips 2 are LED chips, an emission wavelength of each LED chip is not limited in particular. Accordingly, examples of the LED chips include an ultraviolet LED chip, a purple LED chip, a blue LED chip, a green LED chip, a yellow LED chip, an orange LED chip, and a red LED chip. In addition, examples of the LED chips include a white LED chip.

Figure 3A:
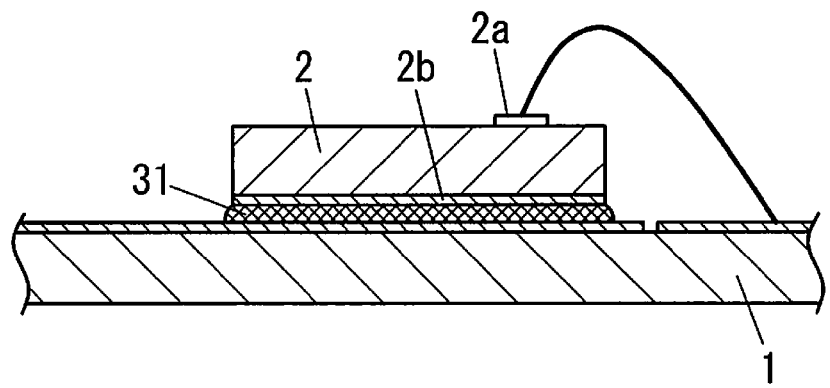
FIG. 3A is an explanatory drawing for an aspect of mounting chips on a substrate in the mounting method according to the embodiment.

As each chip 2, an LED chip may be used, where a first electrode 2a is formed on a side of a main surface of the LED chip and a second electrode 2b is formed on an opposite side of the LED chip from the main surface, as shown in FIG. 3A. In this chip 2, the second metal layer 21 (not shown in FIG. 3A) may be stacked on the second electrode 2b, or the outermost surface side of the second electrode 2b may be configured as the second metal layer 21 (not shown in FIG. 3A), or the second electrode 2b may be configured as the second metal layer 21 (not shown in FIG. 3A). Note that, in the mounting aspect of FIG. 3A, one of the first and second electrodes 2a and 2b is an anode electrode, and the other is a cathode electrode.

Figure 3B:
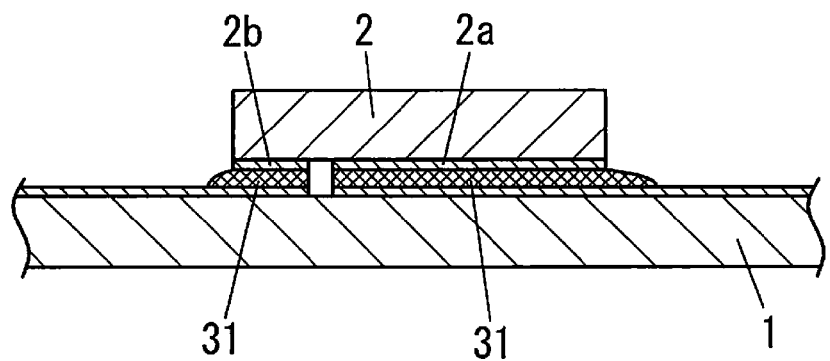
FIG. 3B is an explanatory drawing for an aspect of mounting the chips on the substrate in the mounting method according to the embodiment.
Figure 4:
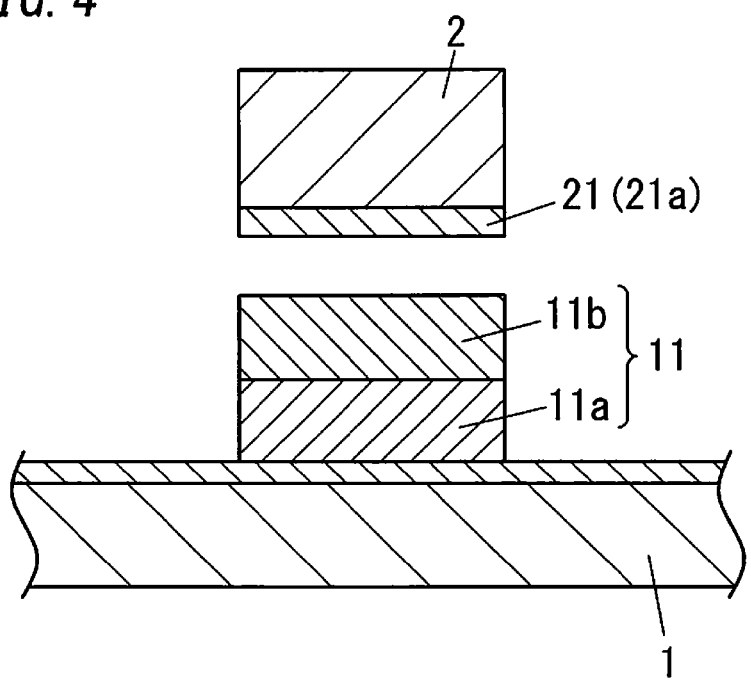
FIG. 4 is an explanatory drawing for another first basic process in the mounting method according to the embodiment.

Alternatively, as each chip 2, an LED chip may be used, where first and second electrodes 2a and 2b are formed on one surface side of the LED chip in a thickness direction thereof, as shown in FIG. 3B. In other words, both of first and second electrodes 2a and 2b are formed on a lower surface of the chip 2 shown in FIG. 3B, while being spaced at a prescribed distance. In this chip 2, the second metal layer 21 (not shown in FIG. 3B) may be stacked on each of the first and second electrode 2a and 2b, or the outermost surface side of each of the first and second electrode 2a and 2b may be configured as the second metal layer 21 (not shown in FIG. 3B), or each of the first and second electrode 2a and 2b may be configured as the second metal layer 21 (not shown in FIG. 3B). Note that, in the mounting aspect of FIG. 3B, one of the first and second electrodes 2a and 2b is an anode electrode, and the other is a cathode electrode.

As material for each of the first and second metal layers 11 and 21, flux-less material may be used.

In each chip 2, for example, flux-less Au may be used as material for the second metal layer 21. The flux-less Au layer may be formed by a plating method, a sputtering method or an evaporation method, for example.

A combination of materials for the second metal layer 21 of each chip 2 and the first metal layer 11 of the substrate 1 is not limited to Au—AuSn, and may be AuSn—Au for example. If the combination of materials for the second metal layer 21 of each chip 2 and the first metal layer 11 of the substrate 1 is Au—AuSn or AuSn—Au, it is possible to prevent the bonding layer 31 from melting again, in a case of secondarily mounting, on a mother board or the like, the substrate 1 (on which the chips 2 are mounted) or a module (that is divided from the substrate 1 on which the chips 2 are mounted), using SuAgCu.

Examples of the combination of materials for the second metal layer 21 of each chip 2 and the first metal layer 11 of the substrate 1 include AuGe—Au, Au—AuGe, SnBi—Sn, Sn—SnBi, SnCu—Cu, and Cu—SnCu.

It is not limited to the above-mentioned example, in a case of using LED chips as the chips 2, and an AuSn layer as the bonding layer 31 that is formed by subjecting the second metal layer 21 and the first metal layer 11 to the liquid phase diffusion bonding. For example, considered can be also any one of configuration examples shown in FIGS. 4 to 6B. In the configuration example of FIG. 4, the second metal layer 21 of the chip 2 is configured as an Au layer 21a, and the first metal layer 11 of the substrate 1 includes a first layer 11a as a Sn layer or an AuSn layer, and a second layer 11b as an Au layer that is on the first layer 11a. Accordingly, the substrate 1 can suppress oxidation of the Sn layer of the first metal layer 11.

Figure 5:
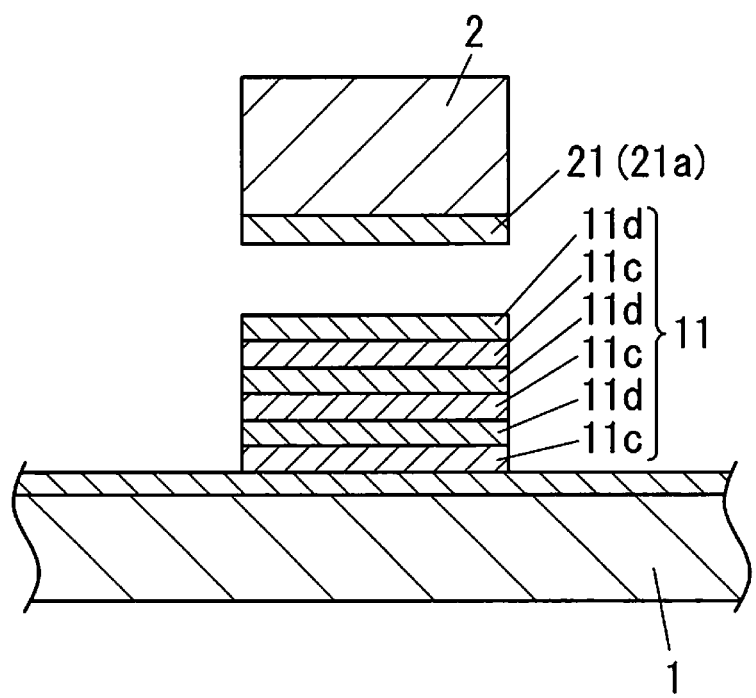
FIG. 5 is an explanatory drawing for yet another first basic process in the mounting method according to the embodiment.

In the configuration example of FIG. 5, the second metal layer 21 of the chip 2 is configured as an Au layer 21a, and the first metal layer 11 of the substrate 1 has a multilayer structure in which Sn layers 11e and Au layers 11d are alternately stacked and the outermost surface is configured as an Au layer 11d. Therefore, the substrate 1 can suppress oxidation of the Sn layers 11c of the first metal layer 11. In the main-bonding process, it is possible to easily perform formation of AuSn when Sn is made to be melted.

Figure 6A:
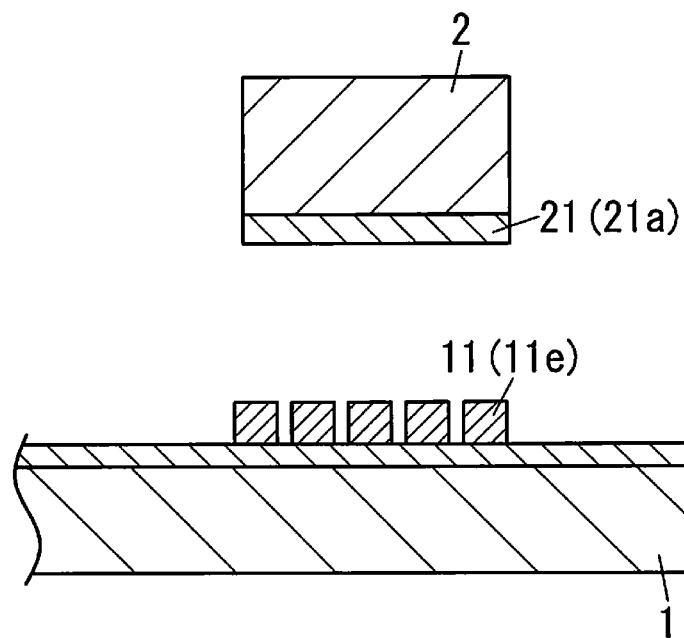
FIG. 6A is an explanatory drawing for yet another first basic process in the mounting method according to the embodiment.
Figure 6B:
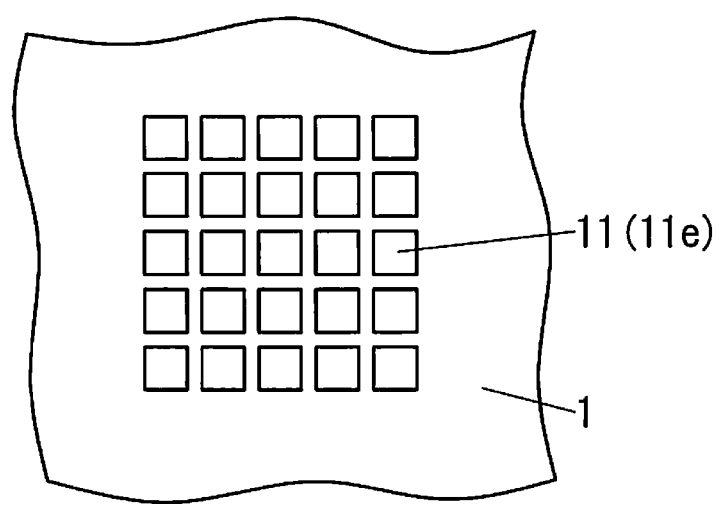
FIG. 6B is an explanatory drawing for yet another first basic process in the mounting method according to the embodiment.

In the configuration example of FIGS. 6A and 6B, the second metal layer 21 of the chip 2 is configured as an Au layer 21a, and the first metal layer 11 of the substrate 1 is configured as a planar-shaped AuSn layer 11e with lattice-like slits. Therefore, in the main-bowling process, it is possible to reduce variation in a start point of the bonding (a place where alloying starts) when the AuSn layer 11e is made to be melted, and accordingly it is possible to reduce variation in bonding strength, variation in a bonded area, an unbonded area, or the like.

Regarding the examples of FIGS. 4 to 6B, the components of the first metal layer 11 and the second metal layer 21 may be replaced with each other.

The chips 2 are not limited to LED chips. Examples of the chips 2 include a laser diode chip, a photodiode chip, a GaN-based HEMT (High Electron Mobility Transistor) chip, an MEMS (Micro Electro Mechanical Systems) chip, an infrared sensor chip, and an IC chip. Examples of the MEMS chip include an acceleration sensor chip and a pressure sensor chip.

Chip-size of each chip 2 is not limited in particular. Each chip 2 may be in a range of about 0.2 mm to 5 mm in chip-size, for example. In planar view, the outer peripheral shape of each chip 2 is not limited to a square, and may be a rectangle for example.

Also, thickness of each chip 2 is not limited in particular. Each chip 2 may be in a range of about 0.1 mm to 1 mm in thickness, for example.

The temporarily-bonding process is performed, following a first-substrate-placement process of placing the substrate 1 on a surface of a stage 3a (see FIGS. 1A and 1B) of the first die bonding apparatus. The stage 3a is provided in a peripheral part thereof with suction holes (not shown) through which the substrate 1 and the like on the surface are held by suction. Therefore, the first die bonding apparatus can hold the substrate 1 on the surface of the stage 3a, in a sucked state.

In the first step of the temporarily-bonding process, each chip 2 is aligned on the substrate 1. More specifically, in the first step, a recognition device (not shown) of the first die bonding apparatus recognizes, with high accuracy, a chip 2 as a target to be picked up, before the target is picked up by vacuum suction with a collet 5a of the first die bonding apparatus, from chips 2 held with, for example, a wafer tape (adhesive resin tape) or a chip tray. After that, the recognition device recognizes, with high accuracy, a schedule region of the substrate 1 on the surface of the stage 3a of the first die bonding apparatus, and the chip 2 held by the vacuum suction with the collet 5a is aligned on the substrate 1 (e.g., chip alignment of correcting posture of the chip 2 is performed). Examples of the adhesive resin tape include an ultraviolet-curing type dicing tape and a heat-curing type dicing tape. Although the adhesive resin tape holds the chip 2 by strong adhesion in dicing, the adhesion can be reduced by radiation of ultraviolet rays or infrared rays after the dicing, and accordingly, the pickup performance can be enhanced.

In the second step of the temporarily-bonding process, a bonding surface of the chip 2 is brought into contact with that of the substrate 1, and pressure is applied from the side of the chip 2 to subject the second metal layer 21 of the chip 2 and the first metal layer 11 of the substrate 1 to the solid phase diffusion bonding at the first defined temperature. In the mounting method according to the present embodiment, the chip 2 is temporarily bonded on the substrate 1 by the solid phase diffusion bonding.

In the second step, the chip 2 is heated to the first defined temperature by a heater (not shown) of a bonding head 4a via the collet 5a. In the second step, after the chip 2 is heated to a temperature slightly higher than the first defined temperature, it is adjusted so that the temperature of the chip 2 reaches the first defined temperature by the bonding surface of the chip 2 being brought into contact with that of the substrate 1. However, the heating may be adjusted so that the temperature of the chip 2 reaches the first defined temperature, after the bonding surface of the chip 2 is brought into contact with that of the substrate 1.

The solid phase diffusion bonding is preferably ultrasonic bonding or surface activation bonding, for example. In this case, in the second step, it is possible to perform the temporarily bonding while the chip 2 and the substrate 1 are made to be at a relatively-low temperature, and accordingly, it is possible to perform aligning with high accuracy even when at least one of the chip 2 and the substrate 1 is in a heated state before the temporarily bonding.

The ultrasonic bonding is the solid phase diffusion bonding that is performed using ultrasonic vibration. As the ultrasonic bonding, ultrasonic combined thermo-compression bonding is preferable, which is to perform bonding, using pressure and ultrasonic vibration under a prescribed heating state. In the ultrasonic combined thermo-compression bonding, it is possible to more enhance bonding strength, compared with a case of performing bonding at a normal temperature, using pressure and ultrasonic vibration. Furthermore, in the ultrasonic combined thermo-compression bonding, it is possible to perform bonding at a lower temperature, compared with thermo-compression bonding.

In the surface activation bonding, each other's bonding surfaces are irradiated with argon plasma, argon ion beam or argon atom beam in vacuum before bonding to clean and activate the bonding surfaces, and then the bonding surfaces are brought into contact with each other, and then appropriate load is applied to directly bond the bonding surfaces under the first defined temperature. The first defined temperature is preferably set so that no thermal damage of the chip 2 occurs. When the chip 2 is an LED chip for example, the first defined temperature is preferably set so that a junction temperature of the LED chip does not exceed a maximum junction temperature, and more preferably, is set to be in a range of about a normal temperature to 100 degrees. Here, in the surface activation bonding, if the first defined temperature is set to be in a range of 80 degrees to 100 degrees for example, it is possible to more enhance bonding strength, compared with a case of performing bonding at a normal temperature. Note that, in the surface activation bonding, helium plasma, helium ion beam or helium atom beam may be used, instead of argon plasma, argon ion beam or argon atom beam. Alternatively, neon plasma, neon ion beam or neon atom beam may be used.

Note that, in the second step of performing the solid phase diffusion bonding, it is possible to enhance bonding strength by heating at least one of the chip 2 and the substrate 1 in bonding.

The second step is preferably performed not in air atmosphere but in controlled atmosphere. Examples of the controlled atmosphere include inert gas atmosphere, vacuum atmosphere and reducing gas atmosphere. Examples of the inert gas atmosphere include $N_2$ gas atmosphere and argon gas atmosphere. Examples of the reducing gas atmosphere include $H_2$ gas atmosphere. In the second step, it is possible to suppress oxidation by setting the atmosphere to the inert gas atmosphere or the vacuum atmosphere. Furthermore, in the second step, it is possible to remove unwanted oxide by setting the atmosphere to the reducing gas atmosphere.

The main-bonding process is performed, following a second-substrate-placement process of placing the substrate 1 on a surface of a stage 3*b* (see FIGS. 1C and 1D) of the second die bonding apparatus. The stage 3*b* is provided in a peripheral part thereof with suction holes (not shown) through which the substrate 1 and the like on the surface are held by suction. Therefore, the second die bonding apparatus can hold the substrate 1 on the surface of the stage 3*b*, in a sucked state.

In the third step of the main-bonding process, a position of each chip 2 temporarily bonded on the substrate 1 is recognized. More specifically, in the third step, a recognition device (not shown) of the second die bonding apparatus simply recognizes a chip 2 on the substrate 1, held by suction on the stage 3*b* of the second die bonding apparatus, and aligns the chip 2 with a collet 5*b* of a bonding head 4*b*. Since the second die bonding apparatus simply recognizes the chip 2 with low accuracy, it is possible to simplify the image processing in the image processing unit, compared with a case of recognizing the chip 2 with high accuracy. Therefore, it is possible to shorten time required for recognizing.

In the fourth step of the main-bonding process, pressure is applied from the side of the chip 2 to firmly bond the chip 2 on the substrate 1 at the second defined temperature that is equal to or higher than a higher one of the melting temperatures of the first and second metal layers 11 and 21. More specifically, in the fourth step, heating is performed from the side of the chip 2 with the bonding head 4*b* of the second die bonding apparatus to subject the chip 2 and the substrate 1 to the liquid phase diffusion bonding. The liquid phase diffusion bonding is a method of performing isothermal solidification using diffusion, after temporarily melting and liquefying at least one of the second metal layer 21 of the chip 2 and the first metal layer 11 of the substrate 1. Here, the second metal layer 21 of the chip 2 and the first metal layer 11 of the substrate 1 are subjected to eutectic bonding. The eutectic bonding is a bonding method of using eutectic reaction with respect to liquefying, of the liquid phase diffusion bonding.

In the fourth step, the collet 5*b* at the bonding head 4*b* of the second die bonding apparatus is brought into contact with the chip 2, and then the chip 2 is heated to the second defined temperature by a heater (not shown) of the bonding head 4*b* via the collet 5*b*, and in that state, appropriate defined pressure is kept applied to the chip 2 during a defined time period from the side of the bonding head 4*b*, and thereby in the fourth step, the second metal layer 21 of the chip 2 and the first metal layer 11 of the substrate 1 are subjected to the eutectic bonding. For example, when material for the second metal layer 21 is Au and material for the first metal layer 11 is AuSn, the second defined temperature may be set higher than a melting temperature of AuSn. The defined pressure may be appropriately set to be in a range of about 2 $kg/cm^2$ to 50 $kg/cm^2$ for example. The defined time period may be appropriately set to be in a range of about 0.5 sec to 10 sec for example.

The fourth step is preferably performed not in air atmosphere but in controlled atmosphere. Examples of the controlled atmosphere include inert gas atmosphere, vacuum atmosphere and reducing gas atmosphere. Examples of the inert gas atmosphere include $N_2$ gas atmosphere and argon gas atmosphere. Examples of the reducing gas atmosphere include $H_2$ gas atmosphere. In the fourth step, it is possible to suppress oxidation by setting the atmosphere to the inert gas atmosphere or the vacuum atmosphere. Furthermore, in the fourth step, it is possible to remove unwanted oxide by setting the atmosphere to the reducing gas atmosphere.

In the fourth step, heat is applied from not only the side of the chip 2 but also the side of the substrate 1 via the stage 3*b* by a heater (not shown) of the stage 3*b*. However, it is not limited to this, and the heat may be applied from only the side of the chip 2 or the side of the substrate 1. Here, when material for the second metal layer 21 is AuSn and material for the first metal layer 11 is Au, it is preferable to set temperatures of the heater of the bonding head 4*b* and the heater of the stage 3*b* so that a temperature on the side of the chip 2 is higher than that on the side of the substrate 1. It is preferable to set the temperature of the heater of the stage 3*b* to be equal to or less than a melting point of AuSn. It is because there is concern that a positional deviation occurs regarding the chip 2 mounted with high accuracy, when AuSn is melted again after the chip 2 is mounted.

When the liquid phase diffusion bonding is performed, as a bonding condition, a void fraction (unbonding fraction) of a bonding interface is preferably set to 20% or less for example. The void fraction may be defined as, for example, a ratio of an area of an unbonding region to a desired area of a bonding region (e.g., a desired area of the bonding layer 31). The desired area of the bonding region and the area of the unbonding region may be estimated from, for example, an image obtained by observation with an ultrasonic microscope after the liquid phase diffusion bonding is performed.

In the mounting method according to the present embodiment, the main bonding is performed after the temporarily bonding, and accordingly, it is possible to enhance bonding strength, and furthermore reduce the void. Therefore, in the mounting method according to the present embodiment, it is possible to reduce thermal resistance between the chip 2 and the substrate 1, and reduce variation in the thermal resistance.

The mounting method according to the present embodiment described above includes: the temporarily-bonding process of temporarily individually bonding the chips 2 on the substrate 1; and the main-bonding process of firmly individually bonding, on the substrate 1, the chips 2 temporarily bonded on the substrate 1. Here, the temporarily-bonding process is to perform the first basic process, repeatedly depending on the number of the chips 2 to be mounted on the substrate 1. The first basic process includes the first step and the second step. The first step is to align, on the first metal layer 11 of the substrate 1, the second metal layer 21 of each chip 2. The second step is to subject the first and second metal layers 11 and 21 to the solid phase diffusion bonding, for the temporarily bonding. The main-bonding process is to perform the second basic process, repeatedly depending on the number of the chips 2 on the substrate 1. The second basic process includes the third step and the fourth step. The third step is to recognize the position of each chip 2 temporarily mounted on the substrate 1. The fourth step is to subject the first and second metal layers 11 and 21 to the liquid phase diffusion bonding, for the firmly bonding. Therefore, in the mounting method of the present embodiment, the temporarily-bonding process and the main-bonding process can be respectively performed with separate systems. Accordingly, the temporarily-bonding process and the main-bonding process can be respectively simultaneously performed with respect to two substrates 1 that are different from each other. Therefore, in the mounting method according to the present embodiment, it is possible to shorten the tact time to be required for the mounting process.

In the mounting method, preferably, the solid phase diffusion bonding is performed at the first defined temperature, and the liquid phase diffusion bonding is performed at the second defined temperature that is higher than the first defined temperature, by applying heat from at least one side of the side of each chip 2 and the side of the substrate 1. Thereby, in the mounting method, it is possible to suppress the positional deviation of each chip 2 before and after the main bonding for each chip 2 and the substrate 1, and furthermore, keep constant thermal history related to the chips 2 on the substrate 1.

Furthermore, in the mounting method, the silicon wafer is used as the substrate 1, and accordingly, it is possible to reduce surface roughness of the base layer for the first metal layer 11 and also reduce surface roughness of the first metal layer 11. Therefore, in the mounting method, it is possible to suppress void occurring in the temporarily bonding or the main bonding due to the surface roughness of the first metal layer 11, and enhance the bonding strength. Regarding the surface roughness of the first metal layer 11, for example, the arithmetic mean roughness Ra, defined in Japanese Industrial Standards JIS B 0601-2001 (International Organization for Standardization ISO 4287-1997), is preferably 10 nm or less, and more preferably several nanometers or less.

Although the present invention has been described with reference to certain preferred embodiments, numerous modifications and variations can be made by those skilled in the art without departing from the true spirit and scope of this invention, namely claims.

The invention claimed is:

1. A mounting method of mounting chips on a substrate, comprising:
   a temporarily-bonding process of temporarily individually bonding the chips on the substrate; and
   a main-bonding process of firmly individually bonding, on the substrate, the chips temporarily bonded on the substrate,
   the temporarily-bonding process being of performing a first basic process, repeatedly depending on a number of the chips to be mounted on the substrate, the first basic process comprising:
   aligning, on a first metal layer of the substrate, a second metal layer of each chip; and
   temporarily bonding each chip on the substrate by applying pressure from a side of each chip, in a state where a planar bonding surface of the second metal layer is brought into contact with a planar bonding surface of the first metal layer, after the alignment to subject the first and second metal layers to solid phase diffusion bonding, wherein the solid phase diffusion bonding is ultrasonic bonding or surface activation bonding,
   the main-bonding process being of performing a second basic process, repeatedly depending on the number of the chips on the substrate, the second basic process comprising:
   recognizing a position of each chip temporarily mounted on the substrate; and
   firmly bonding each chip on the substrate by applying pressure from the side of each chip after the recognition to subject the first and second metal layers to liquid phase diffusion bonding.

2. The mounting method according to claim 1, wherein the solid phase diffusion bonding is performed at a first defined temperature, the liquid phase diffusion bonding being performed at a second defined temperature that is higher than the first defined temperature, by applying heat from at least one side of the side of each chip and a side of the substrate.

3. The mounting method according to claim 2, wherein the first defined temperature is lower than a lower one of melting temperatures of the first and second metal layers, the second defined temperature being equal to or higher than a higher one of the melting temperatures of the first and second metal layers.

* * * * *